(12) United States Patent
Marcade et al.

(10) Patent No.: US 7,465,189 B2
(45) Date of Patent: Dec. 16, 2008

(54) METHOD AND APPARATUS FOR ELECTRICALLY COUPLING A COMPONENT TO AN INFORMATION HANDLING SYSTEM

(75) Inventors: Michael Marcade, Pflugerville, TX (US); Zachary Cravens, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 126 days.

(21) Appl. No.: 11/452,755

(22) Filed: Jun. 14, 2006

(65) Prior Publication Data

US 2007/0293085 A1 Dec. 20, 2007

(51) Int. Cl.
*H01R 13/60* (2006.01)
(52) U.S. Cl. .................................. 439/567; 439/78
(58) Field of Classification Search ............ 439/78, 439/83, 571, 567; 361/788, 761, 791
See application file for complete search history.

(56) References Cited

U.S. PATENT DOCUMENTS

| | | | | |
|---|---|---|---|---|
| 4,363,530 A | * | 12/1982 | Verhoeven | .................. 439/557 |
| 4,686,607 A | * | 8/1987 | Johnson | ...................... 361/788 |
| 5,080,611 A | * | 1/1992 | Hypes | ........................ 439/567 |
| 5,634,810 A | * | 6/1997 | Niitsu et al. | ................ 439/378 |
| 5,807,136 A | * | 9/1998 | Mick | ........................... 439/571 |
| 5,827,074 A | * | 10/1998 | Gatti | ............................ 439/61 |
| 6,475,023 B2 | | 11/2002 | Carneling | |
| 6,488,416 B1 | * | 12/2002 | Shishikura et al. | ............ 385/88 |
| 6,517,375 B2 | * | 2/2003 | MacLaren et al. | ........... 439/489 |
| 6,655,990 B2 | | 12/2003 | Terauchi et al. | |
| 6,819,560 B2 | * | 11/2004 | Konshak et al. | ............. 361/687 |
| 6,983,338 B2 | | 1/2006 | Hadba et al. | |
| 7,273,391 B2 | * | 9/2007 | Purwin | ....................... 439/502 |
| 7,290,330 B2 | * | 11/2007 | Sardella et al. | ............... 29/832 |
| 2004/0198104 A1 | | 10/2004 | Hadba et al. | |
| 2006/0056146 A1 | | 3/2006 | Marcade et al. | |
| 2006/0105597 A1 | * | 5/2006 | Purwin | ........................ 439/79 |

* cited by examiner

*Primary Examiner*—Tho D Ta
*Assistant Examiner*—Travis Chambers
(74) *Attorney, Agent, or Firm*—Haynes and Boone, LLP (57) ABSTRACT

A component electrical coupling apparatus includes a board comprising a first surface and a second surface located opposite the first surface. A first surface mount technology connector is coupled to the first surface of the board. A second surface mount technology connector is coupled to the second surface of the board and located immediately opposite the first surface mount technology connector, the second surface mount technology connector operable to couple to a different type of connector than the first surface mount technology connector. The component electrical coupling apparatus may be coupled to a component and to an information handling system to allow the component having a connector to be coupled to an information handling system having a different type of connector than the component.

21 Claims, 10 Drawing Sheets

METHOD AND APPARATUS FOR ELECTRICALLY COUPLING A COMPONENT TO AN INFORMATION HANDLING SYSTEM

BACKGROUND

The present disclosure relates generally to information handling systems, and more particularly to electrically coupling a component to an information handling system.

As the value and use of information continues to increase, individuals and businesses seek additional ways to process and store information. One option is an information handling system (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

Conventional IHSs typically include a number of different components such as, for example, disk drives, that are electrically coupled to the IHS through component connectors on the IHS. The coupling of these components to the component connectors can raise a number of issues.

An IHS may include a plurality of connectors for electrically coupling a plurality of disk drives to the IHS. For example, the IHS may include a plurality of Serial Attached Small Computer System Interface (SAS) connectors for electrically coupling a plurality of SAS disk drives to the IHS. It is sometimes desirable to allow the coupling of Serial Advanced Technology Attachment (SATA) disk drives to the IHS. Furthermore, it may be desirable for the SATA drives to be accessible in a dual port environment when coupled to the SAS connectors, which the SATA drives do not natively support.

Accordingly, it would be desirable to provide for electrically coupling a component to an IHS absent the disadvantages found in the prior methods discussed above.

SUMMARY

According to one embodiment, a component electrical coupling apparatus includes a board comprising a first surface and a second surface located opposite the first surface, a first surface mount technology connector coupled to the first surface of the board, and a second surface mount technology connector coupled to the second surface of the board and located immediately opposite the first surface mount technology connector, the second surface mount technology connector operable to couple to a different type of connector than the first surface mount technology connector.

BRIEF DESCRIPTION OF THE DRAWINGS

FIG. 2b is a top view illustrating an embodiment of the component electrical coupling apparatus of FIG. 2a.

FIG. 2c is a cross sectional view illustrating an embodiment of the component electrical coupling apparatus of FIG. 2a.

FIG. 2d is a cross sectional view illustrating an embodiment of the component electrical coupling apparatus of FIG. 2a.

FIG. 2e is a cross sectional view illustrating an embodiment of the component electrical coupling apparatus of FIG. 2a.

FIG. 3 is a perspective view illustrating an embodiment of a first component used with the component electrical coupling apparatus of FIG. 2a.

DETAILED DESCRIPTION

For purposes of this disclosure, an IHS may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a network server or storage device, a switch router or other network communication device, or any other suitable device and may vary in size, shape, performance, functionality, and price. The IHS may include memory, one or more processing resources such as a central processing unit (CPU) or hardware or software control logic. Additional components of the IHS may include one or more storage devices, one or more communications ports for communicating with external devices as well as various input and output (I/O) devices, such as a keyboard, a mouse, and a video display. The IHS may also include one or more buses operable to transmit communications between the various hardware components.

Figure 1:
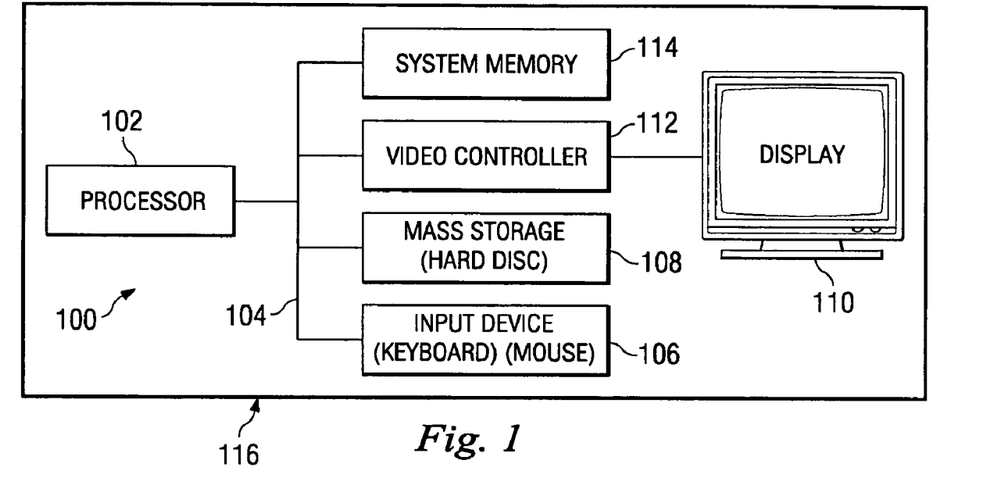
FIG. 1 is a schematic view illustrating an embodiment of an IHS.

In one embodiment, IHS 100, FIG. 1, includes a processor 102, which is connected to a bus 104. Bus 104 serves as a connection between processor 102 and other components of computer system 100. An input device 106 is coupled to processor 102 to provide input to processor 102. Examples of input devices include keyboards, touchscreens, and pointing devices such as mouses, trackballs and trackpads. Programs and data are stored on a mass storage device 108, which is coupled to processor 102. Mass storage devices include such devices as hard disks, optical disks, magneto-optical drives, floppy drives and the like. IHS system 100 further includes a display 110, which is coupled to processor 102 by a video controller 112. A system memory 114 is coupled to processor 102 to provide the processor with fast storage to facilitate execution of computer programs by processor 102. In an embodiment, a chassis 116 houses some or all of the components of IHS 100. It should be understood that other buses and intermediate circuits can be deployed between the components described above and processor 102 to facilitate interconnection between the components and the processor 102.

Figure 2A:
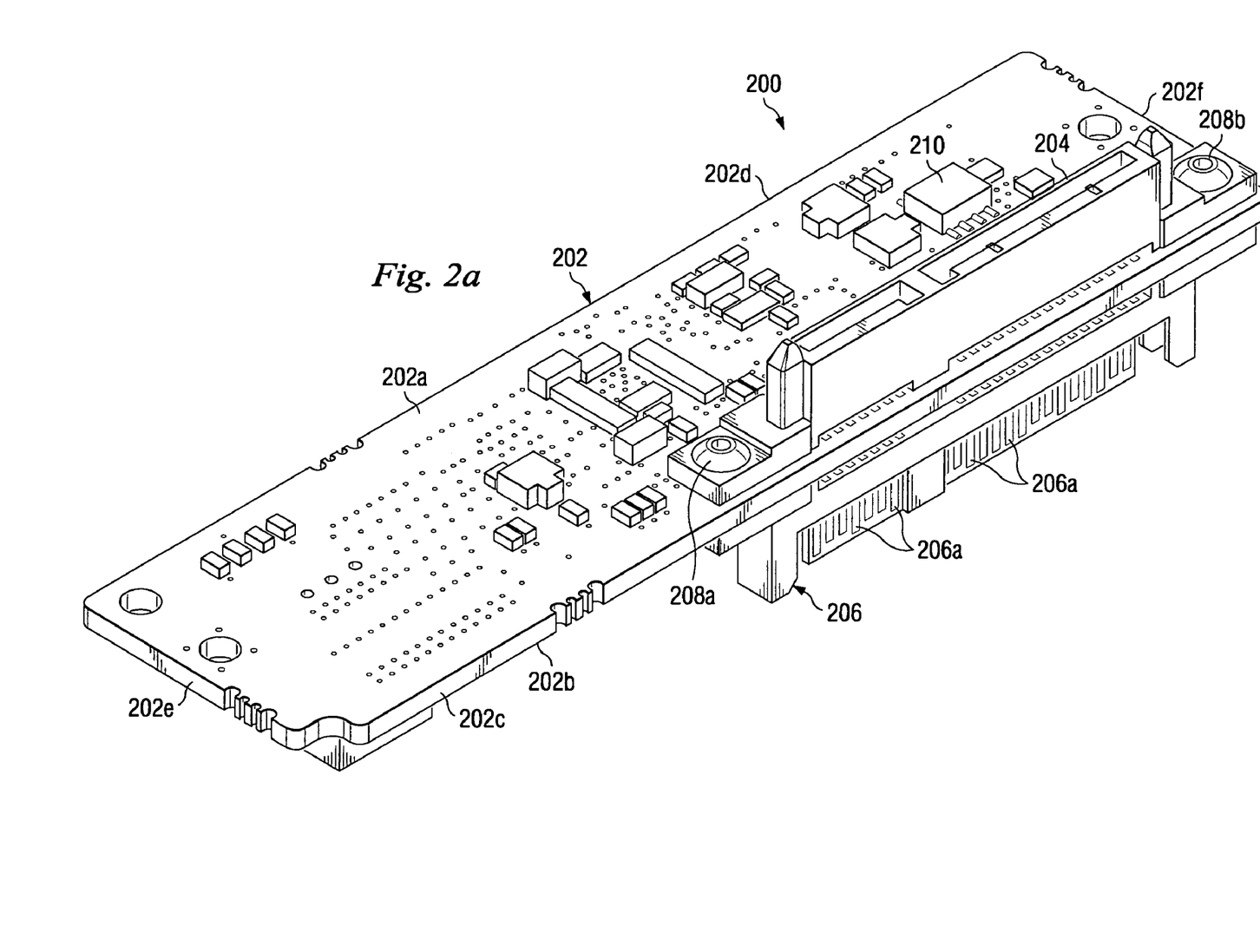
FIG. 2a is a perspective view illustrating an embodiment of a component electrical coupling apparatus.
Figure 2B:
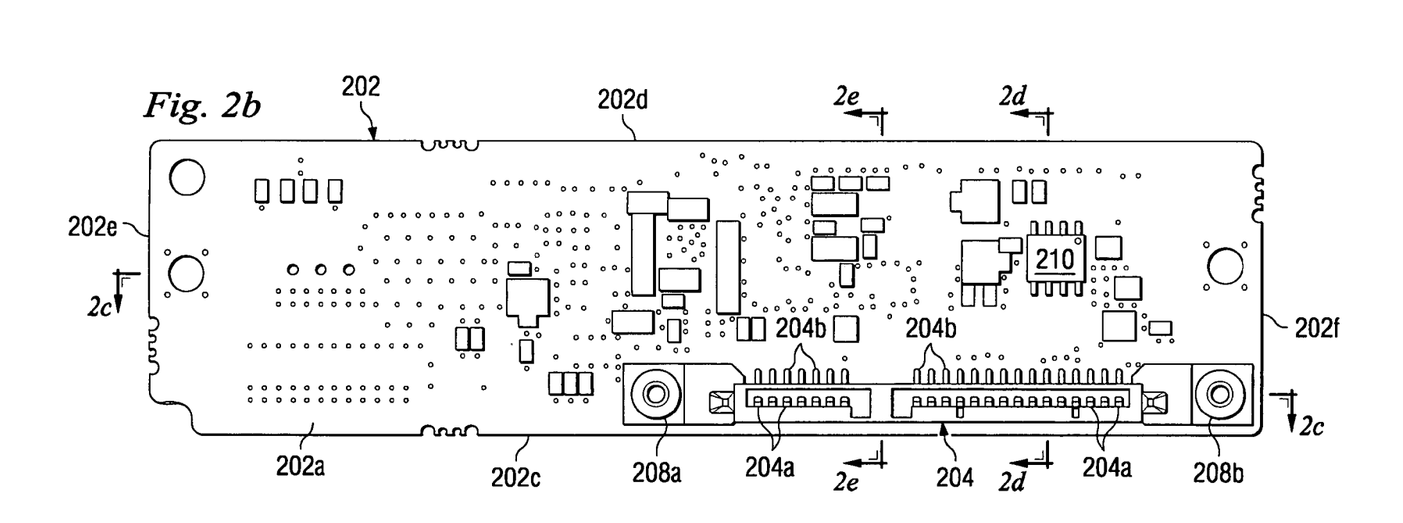
Figure 2C:
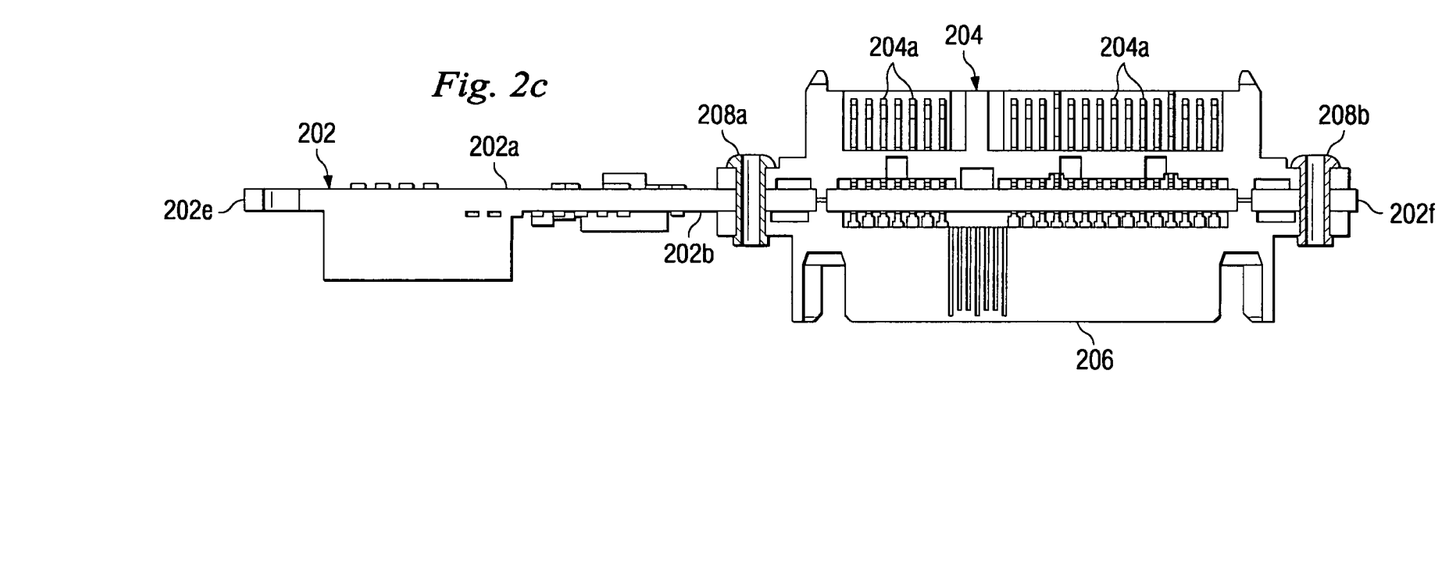
Figure 2D:
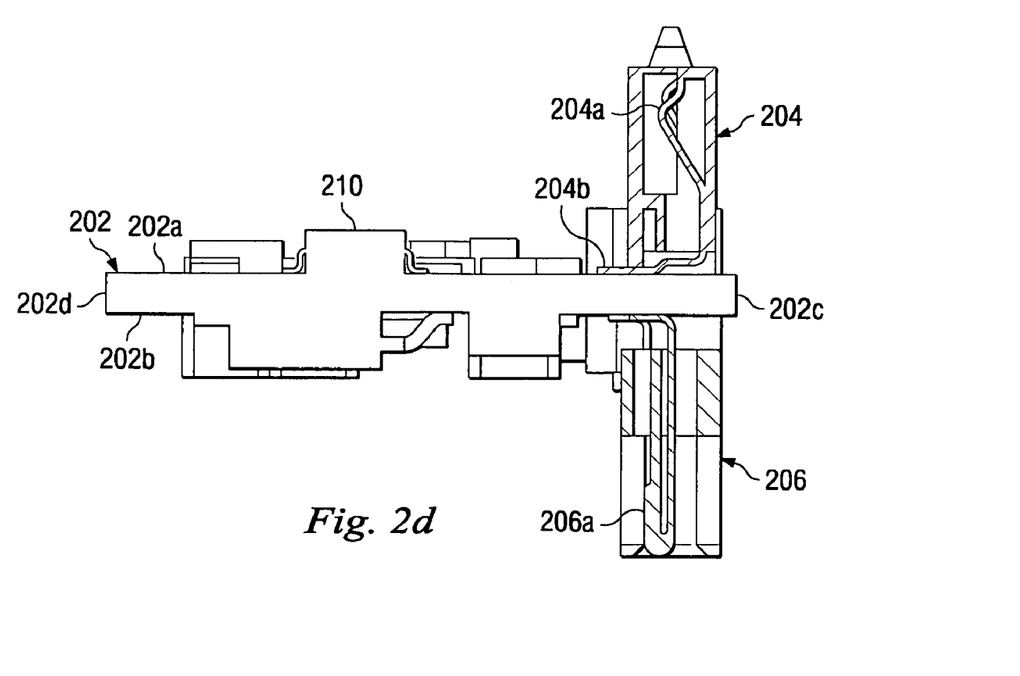
Figure 2E:
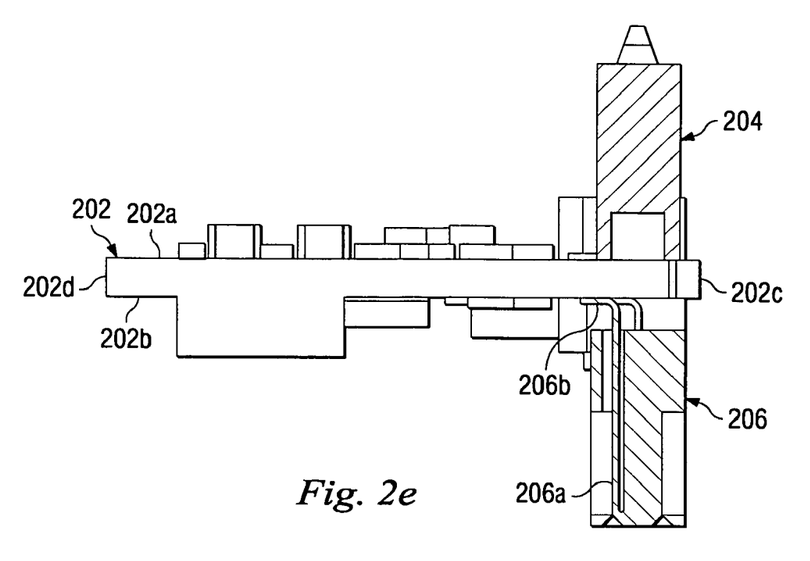

Referring now to FIGS. 2a, 2b, 2c, 2d, and 2e, a component electrical coupling apparatus 200 is illustrated. The component electrical coupling apparatus 200 includes a board 202 having a top first surface 202a, a bottom second surface 202b located opposite the top first surface 202a, a front edge 202c extending between the top first surface 202a and the bottom second surface 202b, a rear edge 202d located opposite the front edge 202c and extending between the top first surface 202a and the bottom second surface 202b, and a pair of opposing side edges 202e and 202f extending between the top first surface 202a, the bottom second surface 202b, the front edge 202c, and the rear edge 202d. A first surface mount technology (SMT) connector 204 and a second SMT connector 206 are coupled to the top first surface 202a and the bottom second surface 202b, respectively, by a plurality of connector couplers 208a and 208b that engage the first SMT connector 204, extend through the first SMT connector 204, extend through the board 202, engage the board 202, extend through the second SMT connector 206, and engage the second SMT connector 206, as illustrated in FIG. 2c. In an embodiment, the plurality of connector couplers 208a and 208b are rivets. In an embodiment, the first SMT connector 204 is a SATA connector. In an embodiment, the second SMT connector 206 is a SAS connector. The second SMT connector 206 is located immediately opposite the first SMT connector 204 on the board 202. The first SMT connector 204 includes a plurality of contacts 204a that are coupled to a plurality of pins 204b that extend from the first SMT connector 204, into contact with the top first surface 202a of the board 202, and away from the front edge 202c of the board 202c, as illustrated in FIG. 2d. In an embodiment, the pins 204b extend from a SATA connector and are oriented in a 180 degree rotated orientation relative to their standard orientation such that they can extend away from the front edge 202c of the board 202. The second SMT connector 206 includes a plurality of contacts 206a that are coupled to a plurality of pins 206b that extend from the second SMT connector 206, into contact with the top first surface 202a of the board 202, and away from the front edge 202c of the board 202c, as illustrated in FIG. 2e. In an embodiment, the pins 206b extend from a SAS connector and are oriented in a 180 degree rotated orientation relative to their standard orientation such that they can extend away from the front edge 202c of the board 202. A processor 210 is coupled to the top first surface 202a of the board 202 and electrically coupled to the first SMT connector 204 and/or the second SMT connector 206. In an embodiment, the first SMT connector 204 is a SATA connector and the processor 210 includes component operable to provide dual port data capability to a SATA disk drive coupled to the SATA connector.

Figure 3:
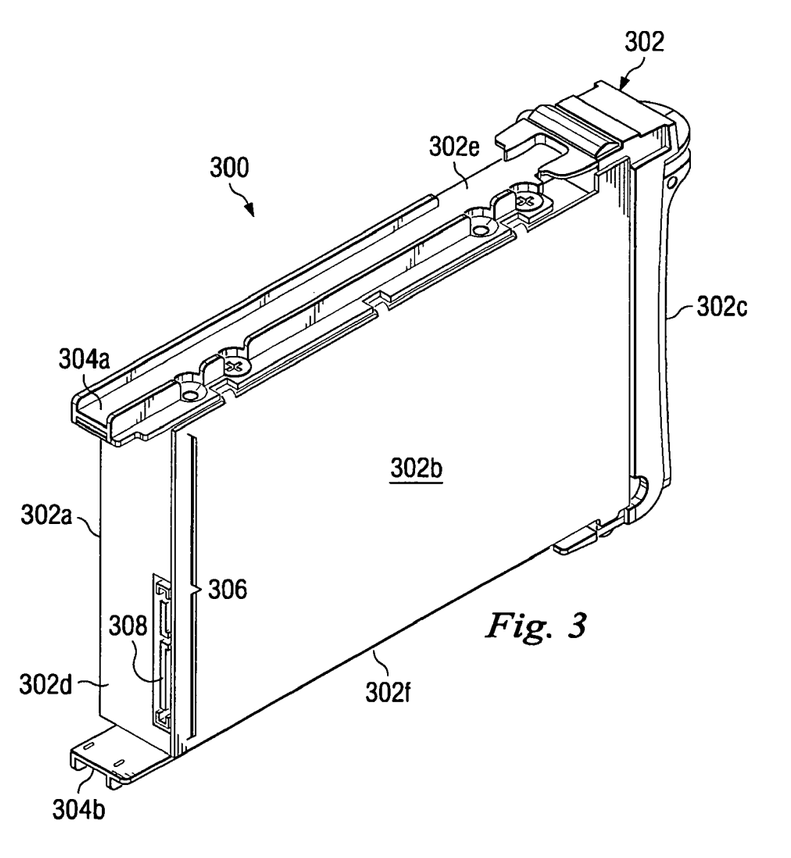

Referring now to FIG. 3, a first component 300 is illustrated. The first component 300 includes a base 302 having a top surface 302a, a bottom surface 302b located opposite the top surface 302a, a front surface 302c extending between the top surface 302a and the bottom surface 302b, a rear surface 302d located opposite the front surface 302c and extending between the top surface 302a and the bottom surface 302b, and a pair of opposing side surfaces 302e and 302f extending between the top surface 302a, the bottom surface 302b, the front surface 302c, and the rear surface 302d. The side surfaces 302e and 302f include side walls 304a and 304b, respectively, that extend from the side surfaces 302e and 302f, respectively, and out past the top surface 302a, the bottom surface 302b, and the rear surface 302d. The side walls 304a and 304b define a rear channel 306 between them and adjacent the rear surface 302d of the base 302. A first IHS connector 308 extends from the rear surface 302d of the base 302 into the rear channel 306 and is located adjacent the bottom surface 302b and the side wall 304b. In an embodiment, the first component 300 is a SATA disk drive and the first IHS connector 308 is a SATA connector.

Figure 4:
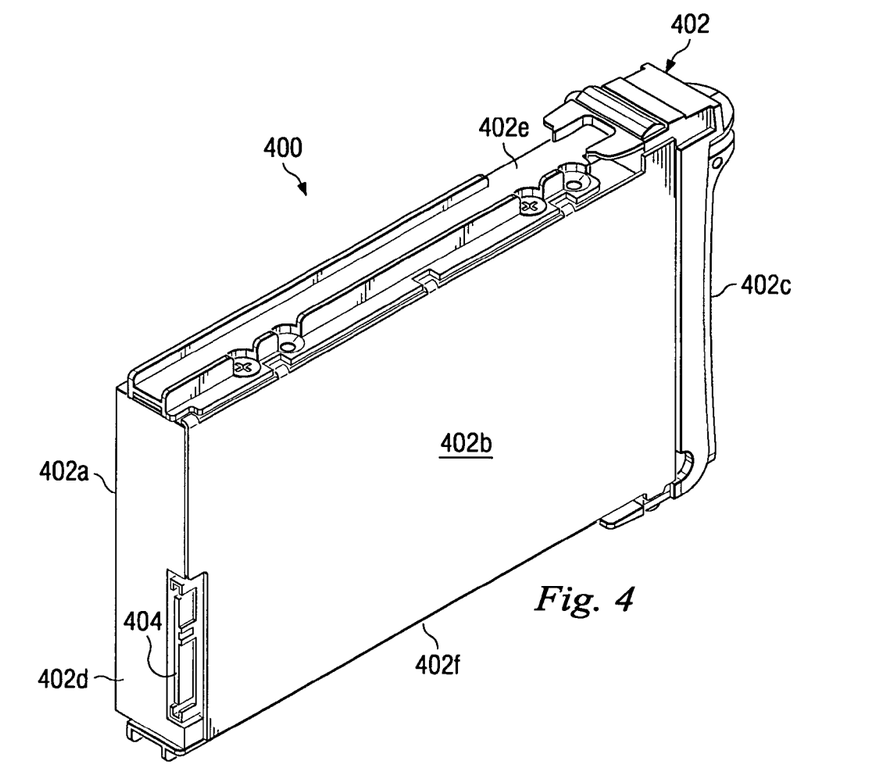
FIG. 4 is a perspective view illustrating an embodiment of a second component.

Referring now to FIG. 4, a second component 400 is illustrated. The second component 400 includes a base 402 having a top surface 402a, a bottom surface 402b located opposite the top surface 402a, a front surface 402c extending between the top surface 402a and the bottom surface 402b, a rear surface 402d located opposite the front surface 402c and extending between the top surface 402a and the bottom surface 402b, and a pair of opposing side surfaces 402e and 402f extending between the top surface 402a, the bottom surface 402b, the front surface 402c, and the rear surface 402d. A second IHS connector 404 extends from the rear surface 402d of the base 402 and is located adjacent the bottom surface 402b and the side surface 402f. In an embodiment, the second component 400 is a SAS disk drive and the second IHS connector 404 is a SAS connector.

Figure 5:
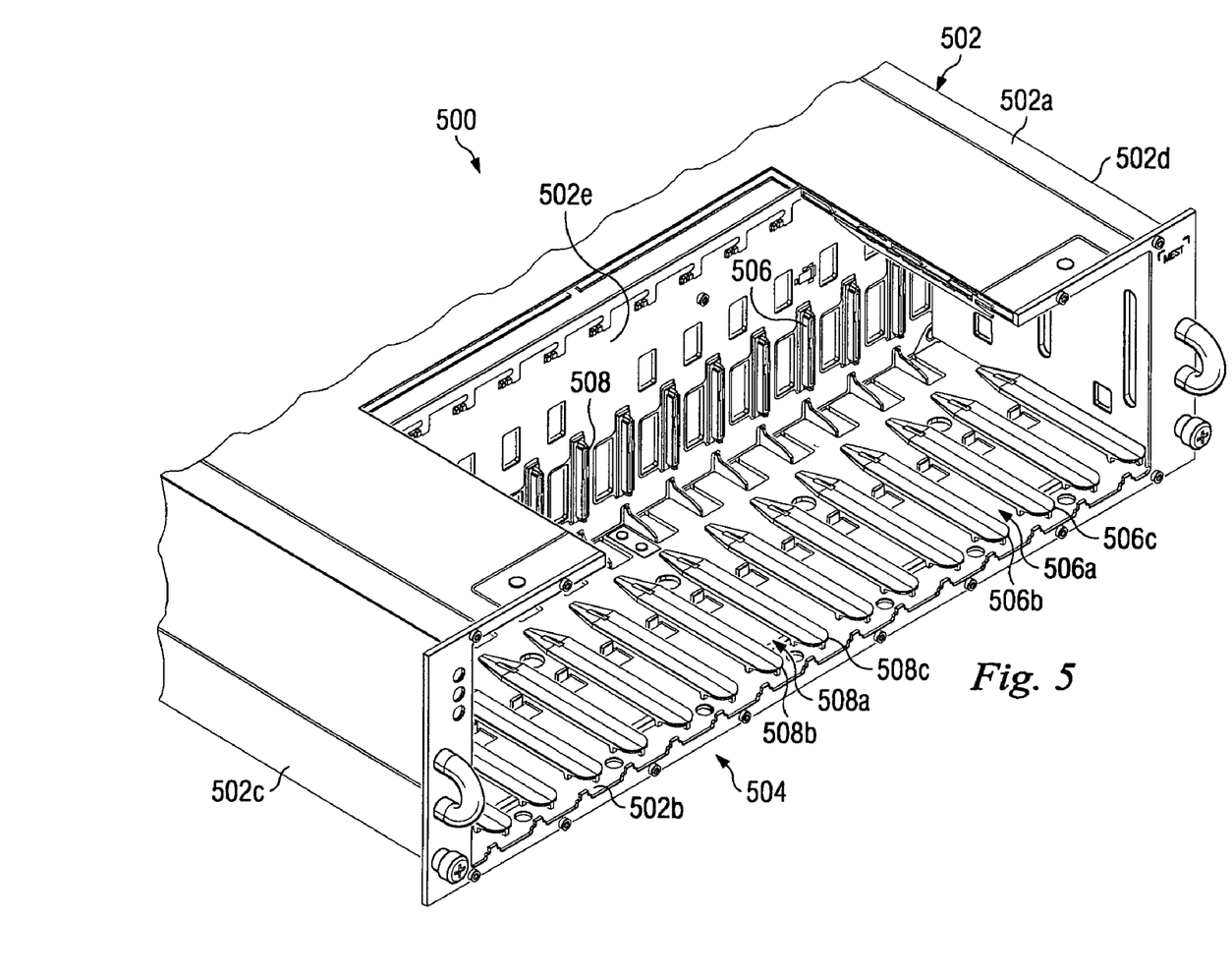
FIG. 5 is a perspective view illustrating an embodiment of an IHS chassis used with the component electrical coupling apparatus of FIG. 2a, the first component of FIG. 3, and the second component of FIG. 4.

Referring now to FIG. 5, an IHS chassis 500 is illustrated. The IHS chassis 500 may be, for example, the chassis 116, described above with reference to FIG. 1, and may house some or all of the components of the IHS 100, described above with reference to FIG. 1. The IHS chassis 500 includes a base 502 having a top wall 502a, a bottom wall 502b located opposite the top wall 502a, an pair of opposing side walls 502c and 502d located in a substantially parallel and spaced apart orientation and extending between the top wall 502a and the bottom wall 502b. A backplane 502e extends between the top wall 502a, the bottom wall 502b, and the side walls 502c and 502d. A component housing 504 is defined by the base 502 and located between the top wall 502a, the bottom wall 502b, the side walls 502c and 502d, and the backplane 502e. A first component connector 506 extends from the backplane 502e and into the component housing 504. In an embodiment, the first component connector 506 is electrically coupled to a processor such as, for example, the processor 102, described above with reference to FIG. 1. A first component channel 506a is defined by a plurality of coupling members 506b and 506c extending from the bottom wall 502b of the base 502 and is located adjacent the first component connector 506. A second component connector 508 extends from the backplane 502e and into the component housing 504. In an embodiment, the second component connector 508 is electrically coupled to a processor such as, for example, the processor 102, described above with reference to FIG. 1. A second component channel 508a is defined by a plurality of coupling members 508b and 508c extending from the bottom wall 502b of the base 502 and is located adjacent the second component connector 508. In an embodiment, the first component connector 506 and the second component connector 508 are operable to couple SAS disk drives to an IHS located in the IHS chassis 500.

Figure 6A:
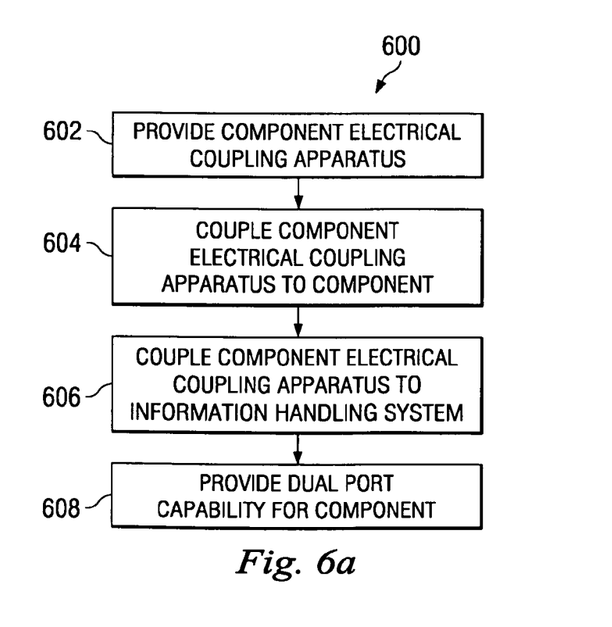
FIG. 6a is a flow chart illustrating an embodiment of a method for electrically coupling a component to an IHS.
Figure 6B:
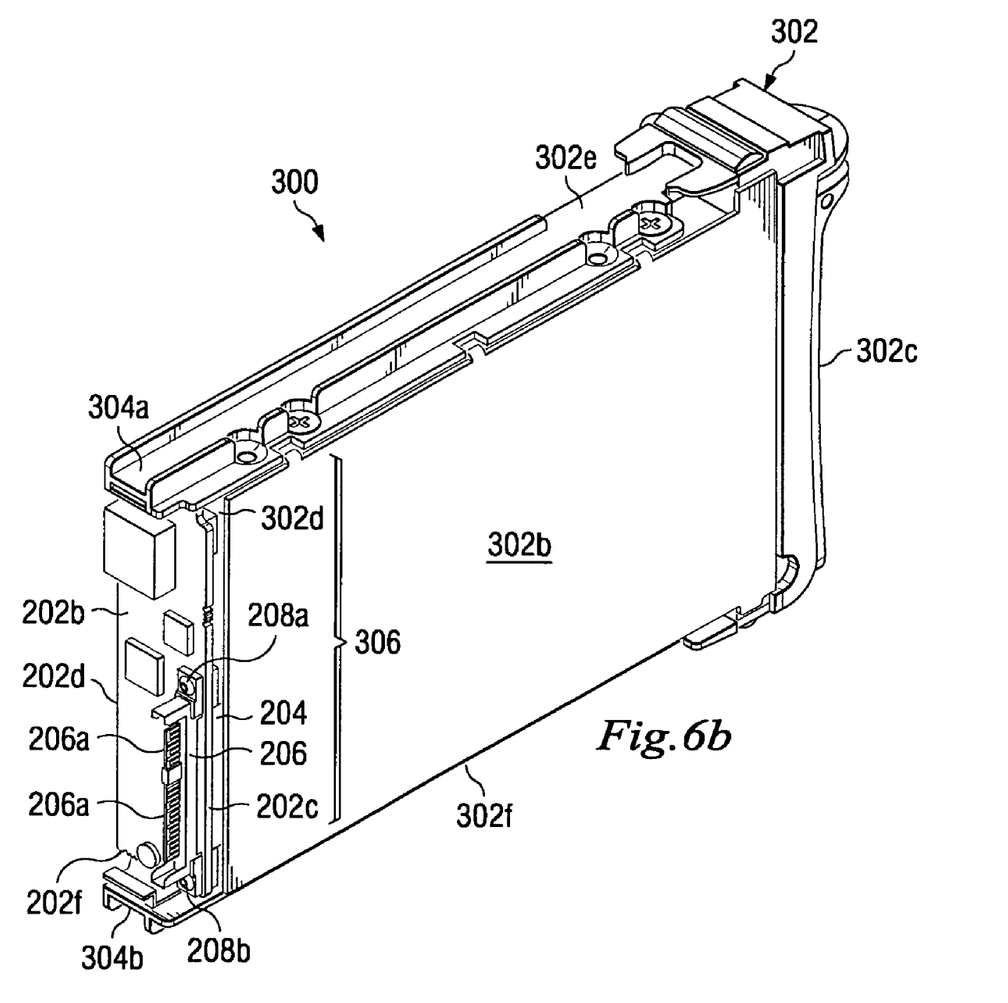
FIG. 6b is a perspective view illustrating an embodiment of the component electrical coupling apparatus of FIG. 2a coupled to the first component of FIG. 3.

Referring now to FIGS. 2a, 2b, 2c, 2d, 2e, 3, 5, 6a, and 6b, a method 600 for electrically coupling a component to an IHS is illustrated. The method 600 begins at step 602 where the component electrical coupling apparatus 200, described above with reference to FIGS. 2a, 2b, 2c, 2d, and 2e, is illustrated. The method 600 then proceeds to step 604 where the component electrical coupling apparatus 200 is coupled to a component. The first component 300, described above with reference to FIG. 3, is provided. The component electrical coupling apparatus 200 is positioned adjacent the first component 300 such that the top surface 202a of the component electrical coupling apparatus 200 is adjacent the rear channel 306 defined by the first component 300, with the side edges 202e and 202f located adjacent the side walls 304a and 304b, respectively, and the first SMT connector 204 is aligned with the first IHS connector 308. The component electrical coupling apparatus 200 is then moved into the rear channel 306 defined by the first component 200 such that the first SMT connector 204 engages the first IHS connector 308 and the second SMT connector 206 extends from the rear channel 306 of the component electrical coupling apparatus 200, as illustrated in FIG. 6b.

Figure 6C:
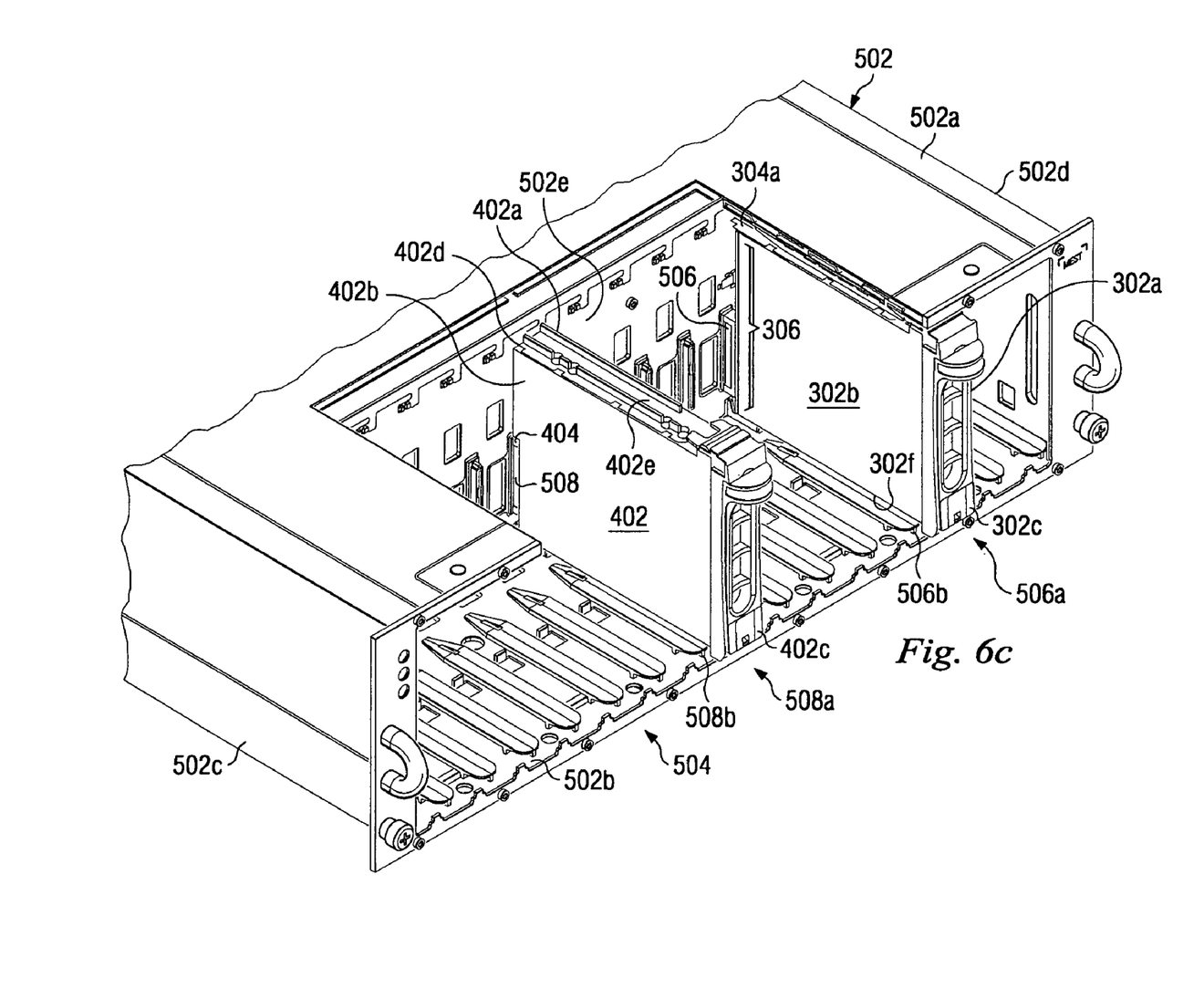
FIG. 6c is a perspective view illustrating an embodiment of the component electrical coupling apparatus and the first component of FIG. 6b and the second component of FIG. 4 coupled to the IHS chassis of FIG. 5.
Figure 6D:
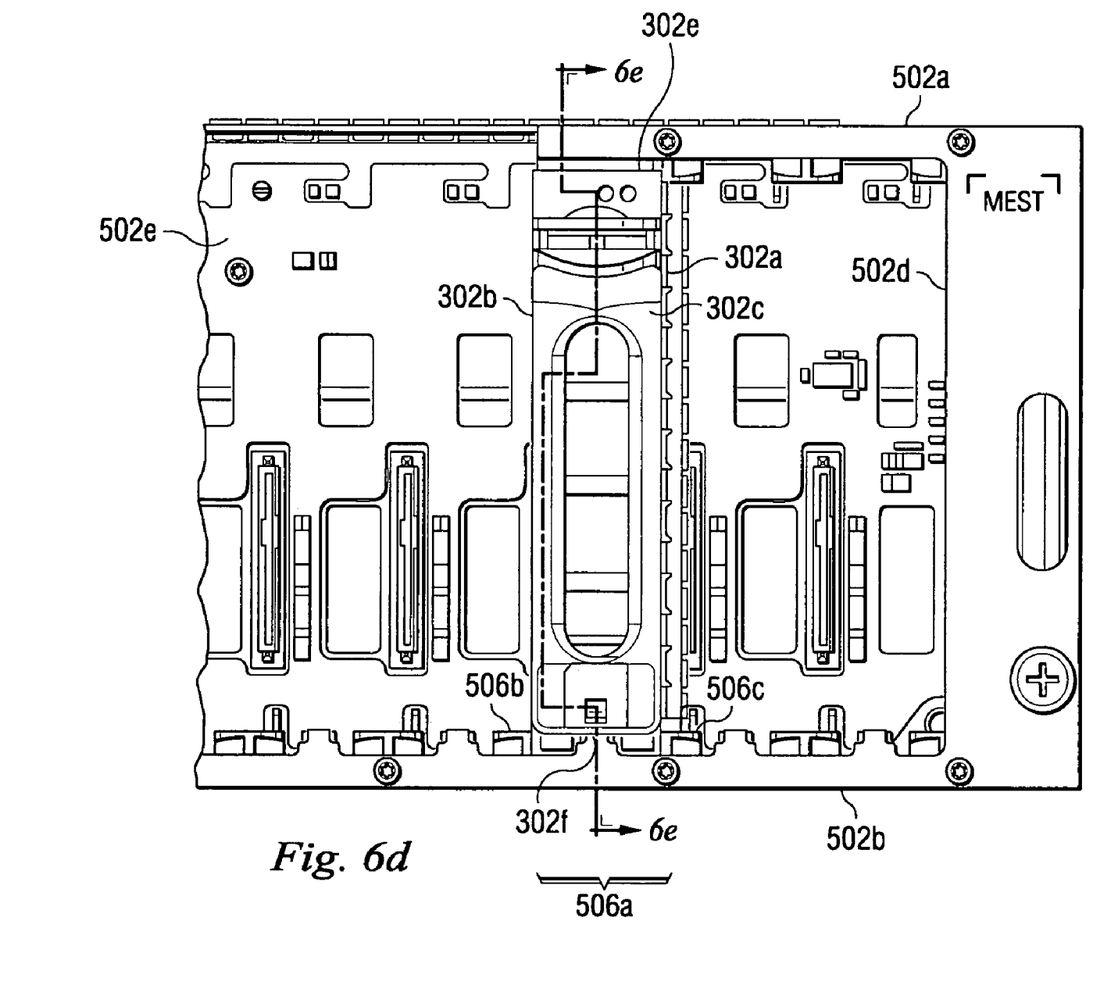
FIG. 6d is a front view illustrating an embodiment of the component electrical coupling apparatus and the first component of FIG. 6b coupled to the IHS chassis of FIG. 5.
Figure 6E:
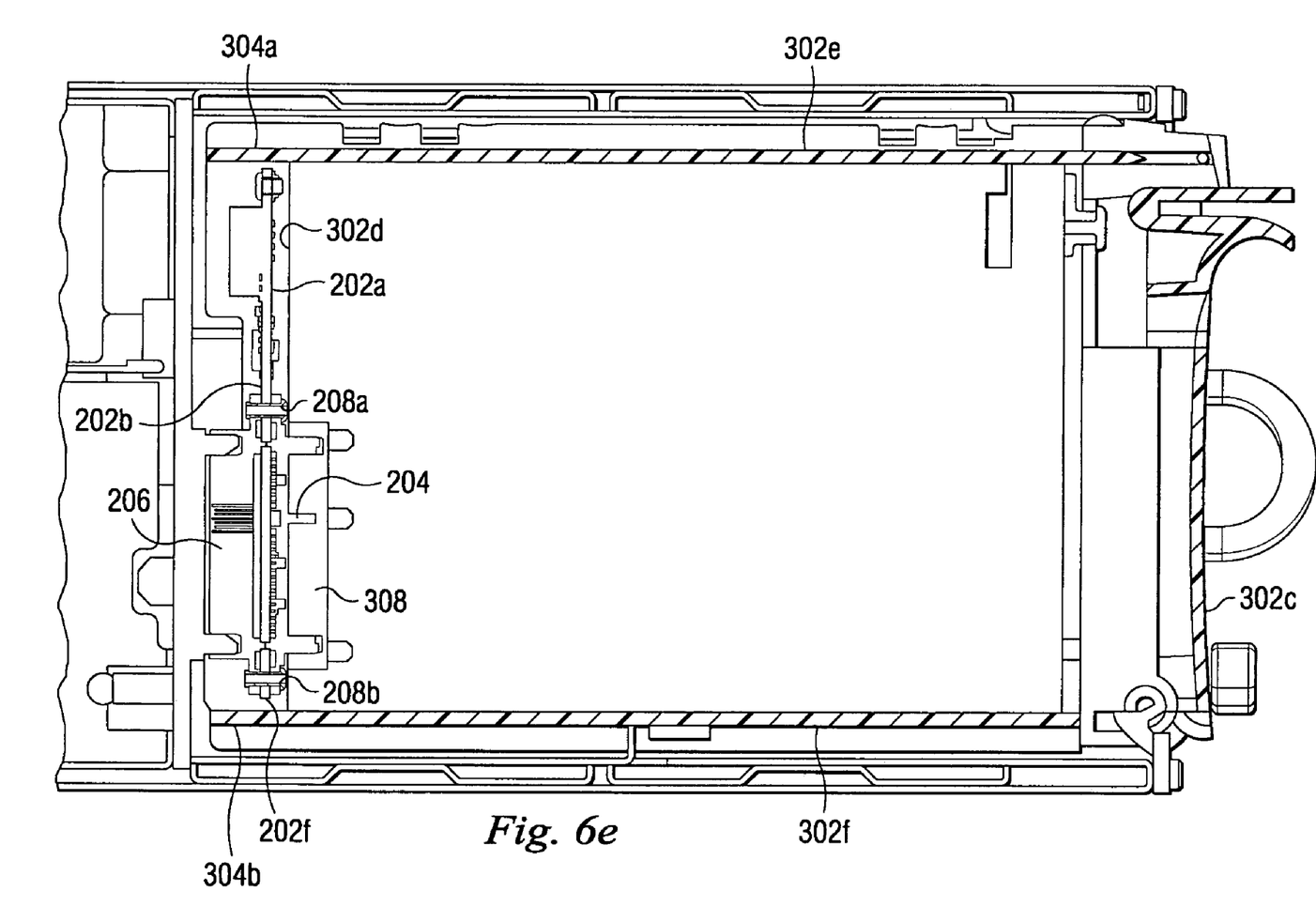
FIG. 6e is a cross sectional view illustrating an embodiment of the component electrical coupling apparatus and the first component of FIG. 6b coupled to the IHS chassis of FIG. 5.

Referring now to FIGS. 2a, 2b, 2c, 2d, 2e, 3, 4 5, 6a, 6b, 6c, 6d, and 6e, the method 600 then proceeds to step 606 where the component electrical coupling apparatus 200 is coupled to an IHS. The IHS chassis 500, described above with reference to FIG. 5, is provided. The first component 300 including the component electrical coupling apparatus 200 is positioned adjacent the first component channel 506a defined in the IHS chassis 500, such that second SMT connector 206 is located adjacent the bottom wall 502b and the coupling members 508b and 508c. The first component 300 is then moved into the first component channel 506a in the component housing 504 such that the side surface 302f is located between the coupling members 508b and 508c. With the side surface 302f located between the coupling members 508b and 508c, the second SMT connector 206 is aligned with the first component connector 506 adjacent the first component channel 506a. Continued movement of the first component 300 into the first component channel 506a results in the engagement of the second SMT connector 206 and the first component connector 506 such that the first component 300 is electrically coupled to an IHS (not shown) located in the IHS chassis 500, as illustrated in FIGS. 6c, 6d, and 6e. In an embodiment, the processor 210 on the component electrical coupling apparatus 200 provides dual port data capability to the first component 300. In an embodiment, the second component 400, described above with reference to FIG. 4, may be coupled to the second component connector 508 by moving the second component 400 through the second component channel 508a defined by the plurality of coupling members 508b and 508c until the second IHS connector 404 on the second component 400 engages the second component connector 508, electrically coupling the second component 400 to an IHS (not shown) located in the IHS chassis 500, as illustrated in FIG. 6c. Thus, a method and apparatus are provided that allow a plurality of different components to be used interchangeably with an IHS utilizing one type of component connector on the IHS.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A component electrical coupling apparatus for coupling to a component that defines a rear channel between a pair of component walls and a component surface that is spaced apart from the distal ends of the component walls, comprising:

a board comprising a first surface and a second surface located opposite the first surface, wherein the second surface is a different surface on the board than the first surface, and wherein the board comprises dimensions such that, when the board is coupled to the component, the board is located in the rear channel, adjacent the component surface and between the pair of component walls, and does not extend beyond either of the component walls;

a first surface mount technology connector comprising a quick release connector and coupled to the first surface of the board; and a second surface mount technology connector comprising a quick release connector, coupled to the second surface of the board, operable to couple to the component when the board is located in the rear channel, and located immediately opposite the first surface mount technology connector, wherein the second surface mount technology connector is a different type of connector than the first surface mount technology connector such that the second surface mount technology connector is operable to couple to a different type of connector than the first surface mount technology connector.

2. The apparatus of claim 1, wherein the first surface mount technology connector and the second surface mount technology connector are coupled to the board with a plurality of connector couplers that engage the first surface mount technology connector, extend through the first surface mount technology connector, the board, and the second surface mount technology connector, and engage the second surface mount technology connector.

3. The apparatus of claim 1, wherein the first surface mount technology connector comprises a Serial Attached Small Computer System Interface (SAS) connector.

4. The apparatus of claim 1, wherein the first surface mount technology connector and the second surface mount technology connector are located adjacent an edge of the board.

5. The apparatus of claim 4, wherein the first surface mount technology connector includes at least one signal pin oriented in a 180 degree rotated orientation relative to the standard orientation of the signal pin such that the signal pin extends from the first surface mount technology connector, into contact with the first surface of the board, and away from the edge of the board.

6. The apparatus of claim 4, wherein the second surface mount technology connector includes at least one signal pin oriented in a 180 degree rotated orientation relative to the standard orientation of the signal pin such that the signal pin extends from the second surface mount technology connector, into contact with the second surface of the board, and away from the edge of the board.

7. The apparatus of claim 1, wherein the second surface mount technology connector comprises a Serial Advanced Technology Attachment (SATA) connector.

8. The apparatus of claim 7, further comprising:

a processor located on the board and electrically coupled to the SATA connector, wherein the processor is operable to provide dual port data capability to a SATA disk drive coupled to the SATA connector.

9. An information handling system (IHS), comprising:

a first processor;

a first component connector electrically coupled to the first processor; and a first component comprising a first IHS connector that is a different type of connector than the first component connector such that the first component connector and the first IHS connector cannot be directly connected together, the first IHS connector electrically coupled to the first component connector by a component electrical coupling apparatus that is located in a rear channel, the rear channel defined between a plurality of component walls and a component surface that is spaced apart from the distal ends of the component walls, on the first component, the component electrical coupling apparatus comprising:

a board comprising a first surface and a second surface located opposite the first surface, wherein the second surface is a different surface on the board than the first surface, and wherein the board comprises dimensions such that the board does not extend beyond the plurality of component walls;

a first surface mount technology connector coupled to the first surface of the board and electrically coupled to the first component connector; and a second surface mount technology connector coupled to the second surface of the board and located immediately opposite the first surface mount technology connector, the second surface mount technology connector coupled to the first IHS connector on the first component.

10. The system of claim 9, wherein the first surface mount technology connector and the second surface mount technology connector are coupled to the board with a plurality of connector couplers that engage the first surface mount technology connector, extend through the first surface mount technology connector, the board, and the second surface mount technology connector, and engage the second surface mount technology connector.

11. The system of claim 9, wherein the first surface mount technology connector and the first component connector comprise SAS connectors.

12. The system of claim 9, wherein the first surface mount technology connector and the second surface mount technology connector are located adjacent an edge of the board.

13. The system of claim 12, wherein the first surface mount technology connector includes at least one signal pin oriented in a 180 degree rotated orientation relative to the standard orientation of the signal pin such that the signal pin extends from the first surface mount technology connector, into contact with the first surface of the board, and away from the edge of the board.

14. The system of claim 12, wherein the second surface mount technology connector includes at least one signal pin oriented in a 180 degree rotated orientation relative to the standard orientation of the signal pin such that the signal pin extends from the second surface mount technology connector, into contact with the second surface of the board, and away from the edge of the board.

15. The system of claim 9, wherein the second surface mount technology connector and the IHS connector comprise SATA connectors and the first component is a SATA disk drive.

16. The system of claim 15, further comprising:
a second processor located on the board and electrically coupled to the SATA connector, wherein the processor is operable to provide dual port data capability to the SATA disk drive.

17. The system of claim 9, further comprising:
a second component connector electrically coupled to the first processor; and
a second component comprising a second IHS connector that is coupled to a second component connector.

18. The system of claim 17, wherein the second component connector and the second IHS connector comprise SAS connectors, the second component comprises a SAS disk drive.

19. A method for electrically coupling a component to an IHS, comprising:

providing a component electrical coupling apparatus comprising a board comprising a first surface mount technology connector located on a first surface of the board and a second surface mount technology connector located immediately opposite the first surface mount technology connector on a second surface of the board that is opposite the first surface, wherein the second surface is a different surface on the board than the first surface;

positioning the component electrical coupling apparatus in a rear channel, the rear channel defined between a plurality of component walls and a component surface that is spaced apart from the distal ends of the component walls, on a component, wherein the board comprises dimensions such that the board does not extend beyond the plurality of component walls;

electrically coupling the second surface mount technology connector to an IHS connector on the component; and electrically coupling the first surface mount technology connector to a component connector on an IHS, wherein the component connector on the IHS is a different type of connector than the IHS connector on the component such that the component connector and the IHS connector cannot be directly connected together.

20. The method of claim 19, wherein the first surface mount technology connector and the component connector are SAS connectors, the second surface mount technology connector and the IHS connector are SATA connectors, and the component is a SATA disk drive.

21. The method of claim 20, further comprising:
providing dual port data capability for the SATA disk drive through a processor located on the board.

* * * * *